(12) United States Patent
Hu et al.

(10) Patent No.: US 8,283,741 B2
(45) Date of Patent: Oct. 9, 2012

(54) OPTIMIZED FREE LAYER FOR SPIN TORQUE MAGNETIC RANDOM ACCESS MEMORY

(75) Inventors: Guohan Hu, Yorktown Heights, NY (US); Jonathan Z. Sun, Yorktown Heights, NY (US); Daniel Christopher Worledge, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 283 days.

(21) Appl. No.: 12/684,372

(22) Filed: Jan. 8, 2010

(65) Prior Publication Data
US 2011/0169111 A1  Jul. 14, 2011

(51) Int. Cl.
*H01L 29/82* (2006.01)
(52) U.S. Cl. .......................... 257/421; 360/25; 360/135
(58) Field of Classification Search .............. 360/25, 360/135; 257/421, E29.323
See application file for complete search history.

(56) References Cited

U.S. PATENT DOCUMENTS

| | | | |
|---|---|---|---|
| 7,313,013 B2 | 12/2007 | Sun et al. | |
| 7,457,064 B2 * | 11/2008 | Nemoto et al. | ........... 360/25 |
| 7,489,541 B2 | 2/2009 | Pakala et al. | |
| 2004/0247942 A1 | 12/2004 | Wu et al. | |
| 2005/0041456 A1 | 2/2005 | Saito | |
| 2005/0185455 A1 | 8/2005 | Huai | |
| 2007/0096229 A1 * | 5/2007 | Yoshikawa et al. | ........... 257/421 |
| 2007/0137028 A1 | 6/2007 | Carey et al. | |
| 2008/0094886 A1 | 4/2008 | Ranjan et al. | |
| 2008/0253174 A1 | 10/2008 | Yoshikawa et al. | |
| 2009/0027948 A1 | 1/2009 | Ruehrig | |
| 2009/0079018 A1 * | 3/2009 | Nagase et al. | ........... 257/421 |
| 2009/0116137 A1 | 5/2009 | Takekuma et al. | |
| 2009/0218645 A1 | 9/2009 | Ranjan et al. | |
| 2009/0243008 A1 | 10/2009 | Kitagawa et al. | |
| 2010/0020592 A1 | 1/2010 | Hosotani et al. | |
| 2010/0078763 A1 | 4/2010 | Hosotani et al. | |
| 2010/0096716 A1 | 4/2010 | Ranjan et al. | |

OTHER PUBLICATIONS

U.S. Appl. No. 12/815,923, filed on Jun. 15, 2010.
J.H. Jung et al., "Strong perpendicular magnetic anisotropy in thick CoFeB films sandwiched by Pd and MgO layers," Applied Physics Letters, 2010, 3 pgs, vol. 96, American Institute of Physics.
K. Mizunuma et al., "MgO barrier-perpendicular magnetic tunnel junctions with CoFe/Pd multilayers and ferromagnetic insertion layers," Applied Physics Letters, 2009, 3 pgs., vol. 95, American Institute of Physics.
International Search Report; International Application No. PCT/US11/36910; International Filing Date: May 18, 2011; Date of Mailing: Aug. 26, 2011.
International Search Report—Written Opinion; International Application No. PCT/US11/36910; International Filing Date: May 18, 2011; Date of Mailing: Aug. 26, 2011.

(Continued)

*Primary Examiner* — Michael Shingleton
(74) *Attorney, Agent, or Firm* — Cantor Colburn LLP; Vazken Alexanian

(57) ABSTRACT

A magnetic tunnel junction stack that includes a pinned magnetic layer, a tunnel barrier layer formed of magnesium oxide (MgO), and a free magnetic layer formed adjacent to the tunnel barrier layer and of a material having a magnetization perpendicular to an MgO interface of the tunnel barrier layer and with a magnetic moment per unit area within a factor of 2 of approximately 2 nanometers (nm)×300 electromagnetic units per cubic centimeter ($emu/cm^3$).

20 Claims, 3 Drawing Sheets

OTHER PUBLICATIONS

S. Ikeda et al., "Tunnel magnetoresistance of 604% at 300 K by suppression of Ta diffusion in CoFeB/MgO/CoFeB pseudo-spin-valves annealed at high temperature," Applied Physics Letter, 2008, 3 pgs. vol. 93, American Institute of Physics.

Office Action—Non-Final for U.S. Appl. No. 12/815,923, filed Jun. 15, 2010; First Named Inventor: Daniel C. Worledge; Mail Date: Nov. 14, 2011.

* cited by examiner

OPTIMIZED FREE LAYER FOR SPIN TORQUE MAGNETIC RANDOM ACCESS MEMORY

BACKGROUND

The present invention relates to magnetic random access memory, and more specifically, to materials optimized for spin-torque memory using a magnesium oxide (MgO) tunnel barrier layer.

A spin torque magnetic random access memory (MRAM) device uses a two terminal spin-torque based memory element including a pinned layer, a tunnel barrier layer and a free layer in a magnetic tunnel junction (MTJ) stack. The magnetization of the pinned layer is fixed in a direction such that when current passes through the MTJ stack the free layer becomes either parallel or anti-parallel to the pinned layer. Resistance of the device depends on the relative orientation of the free layer and the pinned layers. Recent developments include the use of MgO based magnetic tunnel junction layers. A major problem with the development of a spin-transfer RAM in using MgO as a tunnel barrier layer within the MTJ stack is the amount of switching voltage required to switch the MTJ layer from a parallel state to an anti-parallel state. It is desired to reduce the amount of current needed to switch the device and make the switching reliable at any value of current and avoid read disturbances (i.e. when the device accidently switches due to a small read current).

SUMMARY

The present invention provides magnetic tunnel junction (MTJ) stacks of optimal material choices which provides the switching characteristics required for integrated memory applications of a spin-torque switched MTJ device.

According to one embodiment of the present invention, a MTJ stack is provided. The MTJ stack includes a pinned magnetic layer, a tunnel barrier layer formed of magnesium oxide (MgO), and a free magnetic layer formed adjacent to the tunnel barrier layer and of a material having a magnetic moment perpendicular to an MgO interface of the tunnel barrier layer and with a magnetic moment per unit area within a factor of 2 of approximately 2 nanometers (nm)×300 electromagnetic units per cubic centimeter (emu/cm$^3$).

According to another embodiment of the present invention, a spin-torque based magnetic random access memory (MRAM) device is provided. The spin-torque based MRAM device includes a spin-current generating portion including a ferromagnetic film layer, and a conductance layer, a write portion in electrical contact with the ferromagnetic film layer, and a MTJ stack in electrical contact with the conductance layer. The MTJ stack includes a pinned magnetic layer, a tunnel barrier layer formed of magnesium oxide (MgO), a free magnetic layer formed adjacent to the tunnel barrier layer and of a material having a magnetic moment perpendicular to an MgO interface of the tunnel barrier layer and with a magnetic moment per unit area within a factor of 2 of approximately 2 nanometers (nm)×300 electromagnetic units per cubic centimeter (emu/cm$^3$).

According to yet another embodiment of the present invention, a spin-torque MRAM device is provided. The spin-torque based MRAM includes a MTJ stack including a pinned magnetic layer, a tunnel barrier layer formed of magnesium oxide (MgO), and a free magnetic layer formed adjacent to the tunnel barrier layer and formed of manganese aluminum (MnAl).

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
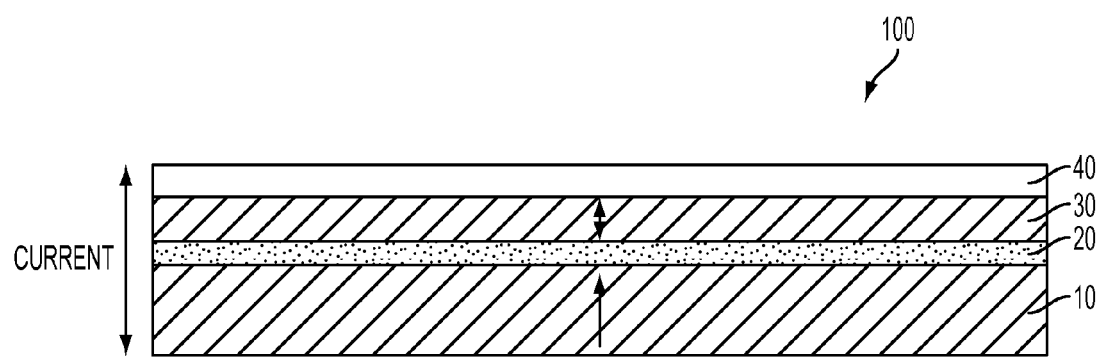
FIG. 1 is diagram illustrating a magnetic tunnel junction (MTJ) stack that can be implemented within embodiments of the present invention.

With reference now to FIG. 1, a magnetic tunnel junction (MTJ) stack according to an embodiment of the present invention is provided. As shown in FIG. 1, an MJT stack 100 includes a pinned magnetic layer 10, a tunnel barrier layer 20, a free magnetic layer 30 adjacent to the tunnel barrier layer 20, and a capping layer 40. According to an embodiment of the present invention, the pinned magnetic layer 10 is formed of iron platinum (FePt), for example. The pinned magnetic layer 10 may be formed of at least one of Pt or palladium (Pd), and at least one of Fe or cobalt (Co). According to an embodiment of the present invention, the tunnel barrier layer 20 is formed of magnesium oxide (MgO).

The present invention discloses examples of optimal MTJ stack material choices that provide switching characteristics required for integrated memory applications of a spin-torque switched MTJ. For example, according to one embodiment of the present invention, the free magnetic layer 30 has a high magnetoresistance (MR) in the MTJ stack 100. The free magnetic layer 30 is formed of a material which has a 2D interface with the tunnel junction layer 20 that has the symmetry of a square. According to an embodiment of the present invention the lattice parameter is approximately d=2.87 Å. According to an embodiment of the present invention, the free magnetic layer 30 includes a magnetization perpendicular to an MgO interface of the tunnel barrier layer 20 and with a magnetic moment per unit area within a factor of 2 of approximately 2 nanometers (nm)×300 electromagnetic units per cubic centimeter (emu/cm$^3$), a uniaxial anisotropy field ($H_k$) of approximately greater than 1500 oersted (Oe) and a Landau-Lifshitz-Gilbert (LLG) damping ($\alpha$) of approximately less than 0.07. According to another embodiment of the present invention, the free magnetic layer 30 further includes a body centered tetragonal (BCT) crystal structure (i.e., a distorted body-centered cubic (BCC) cell that has been elongated in the direction perpendicular to the MgO interface). According to another embodiment of the present invention, the crystal structure is substantially ordered in an L10 crystal structure (i.e., phase).

According to another embodiment of the present invention, the free magnetic layer 30 may be formed of manganese aluminum (MnAl), iron platinum (FePt), iron palladium (FePd) or other material which is magnetic in the L10 phase and having a magnetic moment per unit area ranging from approximately 300 to 960 nm-emu/cm$^3$. Further, according to another embodiment of the present invention, the free magnetic layer 30 formed of MnAl may be doped with other elements such as copper (Cu) or nickel (Ni), for example.

In FIG. 1, the pinned magnetic layer 10 has a magnetic moment that is fixed in the "y" direction, for example. The free magnetic layer 30 has a magnetic moment that is either parallel or anti-parallel to the magnetic moment of the pinned magnetic layer 10. The tunnel barrier layer 20 is thin enough that a current through it can be established by quantum mechanical tunneling of conduction electrons. The resistance of the free magnetic layer 30 changes in response to the relative orientation between the free magnetic layer 30 and the pinned magnetic layer 10. For example, when a current passes down through the MTJ stack 100 in a direction perpendicular to the MTJ stack 100 layers, the free magnetic layer 30 is rotated parallel to the pinned layer 10 (i.e., "1" memory state), resulting in a lower resistance. When a current is passed up through the MTJ stack 100, the free magnetic layer 30 is rotated anti-parallel to the pinned layer 10 (i.e., "0" memory state), resulting in a higher resistance.

Figure 2:
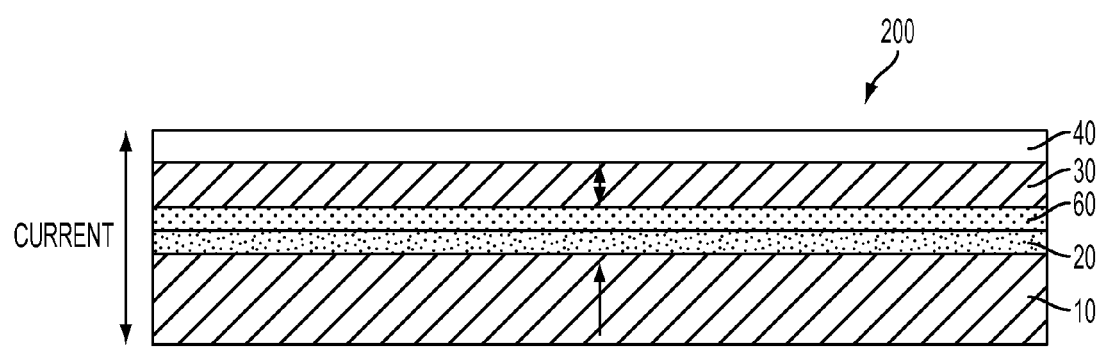
FIG. 2 is a diagram illustrating a MTJ stack that can be implemented within alternative embodiments of the present invention.

The present invention is not limited to a particular arrangement of the MTJ stack as shown in FIG. 1 and may vary accordingly. FIG. 2 is a diagram illustrating an MTJ stack 200 according to an alternative embodiment of the present invention. MTJ stack 200 includes the pinned magnetic layer 10, tunnel barrier layer 20, the free magnetic layer 30 and the capping layer 40. Further, according to the current embodiment of the present invention, an interface layer 60 may be grown between the tunnel barrier layer 20 and the free magnetic layer 30. The interface layer 60 may be a thin layer of at least one of iron (Fe) or cobalt (Co), for example CoFeB or CoFe. According to an embodiment of the present invention, the interface layer is formed of a predetermined thickness of less than one nanometer (nm).

Figure 3:
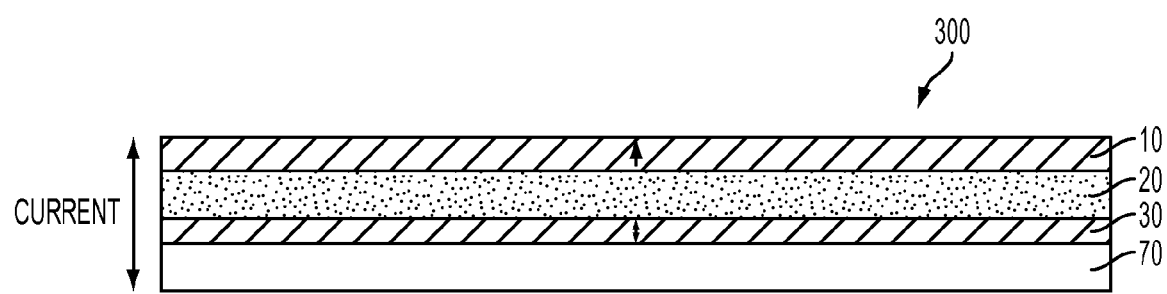
FIG. 3 is a diagram illustrating a MTJ stack that can be implemented within alternative embodiments of the present invention.
Figure 4:
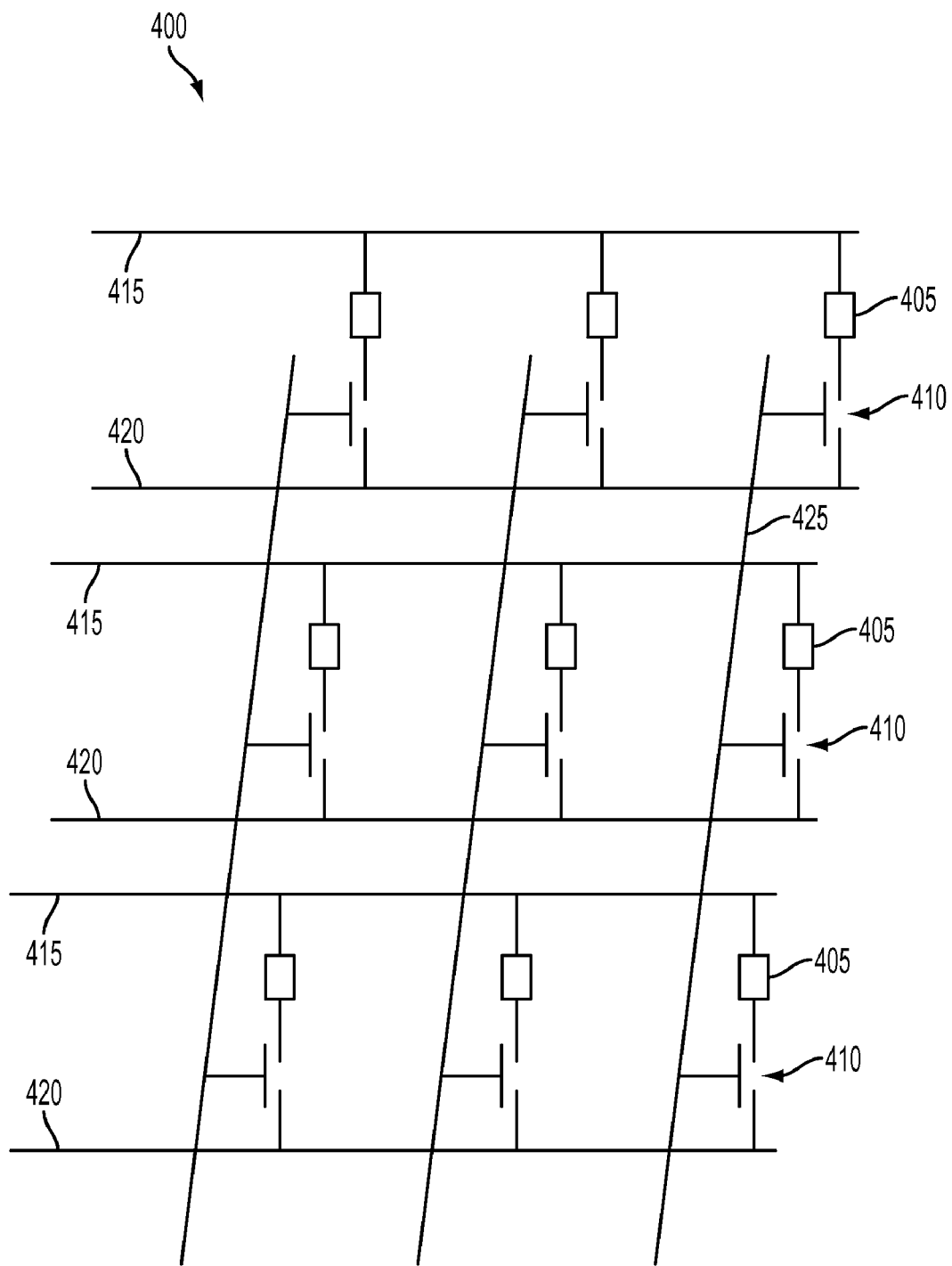
FIG. 4 is a diagram illustrating a spin-torque based magnetic random access memory device having a plurality of MTJ stacks that can be implemented within embodiments of the present invention.

Further, the present invention is not limited to the arrangements shown in FIGS. 1 and 2. FIG. 3 is a diagram illustrating a MTJ stack 300 according to another embodiment of the present invention. As shown in FIG. 3, an MTJ stack 300 has a seed layer 70 instead of a capping layer 40, and the free magnetic layer 30 is formed on the seed layer 70. Further, shown in FIG. 3, the tunnel barrier layer 20 is formed overlying the free magnetic layer 30 and the pinned magnetic layer 10 is formed on the tunnel barrier layer 20. For example, according to the current embodiment of the present invention, the free magnetic layer 30 may be formed of MnAl, for example, and the tunnel barrier layer 20 is formed of MgO on top of the free magnetic layer 30 and the pinned layer 10 is formed on the tunnel barrier layer 20. FIG. 4 is a diagram illustrating a spin-torque based magnetic random access memory (MRAM) device having a plurality of MTJ stacks that can be implemented within embodiments of the present invention. As shown in FIG. 4, the spin-torque based MRAM device 400 includes a plurality of MTJ stacks 405. According to an embodiment of the present invention, the MTJ stacks 405 may be the same as MTJ stacks 100, 200 or 300 shown in FIGS. 1 through 3. Each MTJ stack 405 is connected in series to a transistor 410. Each MTJ stack 405 and the transistor 410 are connected together between a bit line 415 and a bit line complement 420. Further, each transistor 410 is connected at a gate thereof to a word line 425. During a write operation, the spin-polarized electrons exert a torque on a free magnetic layer of the MTJ stack 405, which can switch the polarity of the free magnetic layer. During a read operation, a current is used to detect the resistance/logic state of the MTJ stack 405. Each respective transistor 410 is switched on for both read and write operations to allow current to flow through the respective MTJ stack 405, so that the logic state can be read or written.

The MTJ stacks according to embodiments of the present invention use a free magnetic layer adjacent to a tunnel barrier layer formed of MgO. The free magnetic layer being formed of a material having a magnetization perpendicular to an MgO interface of the tunnel barrier layer and with a magnetic moment per unit area within a factor of 2 of approximately 2 nanometers (nm)×300 emu/cm$^3$, a uniaxial anisotropy field of greater than approximately 1500 Oe and a LLG damping of less than approximately 0.07, such as MnAl. Therefore, the free magnetic layer of the present invention provides BCT lattice match to the MgO tunnel barrier layer, a low magnetic moment, a low LLG damping coefficient, a low spin-flip scattering rate, and a high amount of interface-mediated perpendicular magnetic anisotropy component.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A magnetic tunnel junction stack comprising:
a pinned magnetic layer;
a tunnel barrier layer formed of magnesium oxide (MgO); and
a free magnetic layer formed adjacent to the tunnel barrier layer and of a material having a magnetization perpendicular to the tunnel barrier layer and with a product of a magnetic moment per unit area and a thickness within a factor of 2 of approximately 2 nanometers (nm)×300 electromagnetic units per cubic centimeter (emu/cm$^3$);
wherein the free magnetic layer further includes a body centered tetragonal (BCT) crystal structure.

2. The magnetic tunnel junction stack of claim 1, wherein the free magnetic layer is formed of a material further including a uniaxial anisotropy field of greater than approximately 1500 oersted (Oe).

3. The magnetic tunnel junction stack of claim 2, wherein the free magnetic layer is formed of a material further including a Landau-Lifshitz-Gilbert (LLG) damping of less than approximately 0.07.

4. The magnetic tunnel junction stack of claim 1, wherein the BCT crystal structure is substantially ordered in an L10 phase.

5. The magnetic tunnel junction stack of claim 1, wherein the free magnetic layer is formed of one of iron platinum (FePt) or iron palladium (FePd).

6. The magnetic tunnel junction stack of claim 1, wherein the free magnetic layer is formed of manganese aluminum (MnAl).

7. The magnetic tunnel junction stack of claim 5, wherein the free magnetic layer is doped with copper (Cu) or nickel (Ni).

8. The magnetic tunnel junction stack of claim 1, further comprising an interface layer formed between the tunnel barrier layer and the free magnetic layer, wherein the interface layer is formed of at least one of iron (Fe) or cobalt (Co).

9. The magnetic tunnel junction stack of claim 8, wherein the interface layer is formed of a predetermined thickness of less than one nanometer (nm).

10. A spin-torque based magnetic random access memory device comprising:
a magnetic tunnel junction stack comprising:
a pinned magnetic layer,
a tunnel barrier layer formed of magnesium oxide (MgO), and
a free magnetic layer formed adjacent to the tunnel barrier layer and of a material having a magnetization perpendicular to the tunnel barrier layer and with a product of a magnetic moment per unit area and a thickness within a factor of 2 of approximately 2 nanometers (nm)×300 electromagnetic units per cubic centimeter (emu/cm$^3$);
wherein the free magnetic layer further includes a body centered tetragonal (BCT) crystal structure.

11. The spin-torque based magnetic random access memory device of claim 10, wherein the free magnetic layer is formed of a material further including a uniaxial anisotropy field of greater than approximately 1500 oersted (Oe).

12. The spin-torque based magnetic random access memory device of claim 11, wherein the free magnetic layer is formed of a material further including a Landau-Lifshitz-Gilbert (LLG) damping of less than approximately 0.07.

13. The spin-torque based magnetic random access memory device of claim 10, wherein the BCT crystal structure is substantially ordered in an L10 phase.

14. The spin-torque based magnetic random access memory device of claim 10, wherein the free magnetic layer is formed of one of iron platinum (FePt) or iron palladium (FePd).

15. The spin-torque based magnetic random access memory device of claim 10, wherein the free magnetic layer is formed of manganese aluminum (MnAl).

16. The spin-torque based magnetic random access memory device of claim 14, wherein the free magnetic layer is doped with copper (Cu) or nickel (Ni).

17. The spin-torque based magnetic random access memory device of claim 10, further comprising an interface layer formed between the tunnel barrier layer and the free magnetic layer, wherein the interface layer is formed of at least one of iron (Fe) or cobalt (Co).

18. The spin-torque based magnetic random access memory device of claim 17, wherein the interface layer is formed of a predetermined thickness of less than one nanometer (nm).

19. A spin-torque based magnetic random access memory device comprising:
a magnetic tunnel junction stack comprising:
a pinned magnetic layer,
a tunnel barrier layer formed of magnesium oxide (MgO), and
a free magnetic layer formed adjacent to the tunnel barrier layer and formed of manganese aluminum (MnAl), the free magnetic layer having a magnetization perpendicular to the tunnel barrier layer and with a product of a magnetic moment per unit area and a thickness within a factor of 2 of approximately 2 nanometers (nm)×300 electromagnetic units per cubic centimeter (emu/cm$^3$)
wherein the free magnetic layer further includes a body centered tetragonal (BCT) crystal structure.

20. The spin-torque based magnetic random access memory device of claim 17, further comprising an interface layer formed between the tunnel barrier layer and the free magnetic layer and including of at least one of iron (Fe), cobalt (Co), cobalt iron (CoFe), or cobalt iron boron (CoFeB).

* * * * *